United States Patent [19]

Sugawara

[11] Patent Number: 5,079,524
[45] Date of Patent: Jan. 7, 1992

[54] MICROWAVE OSCILLATION CIRCUIT

[75] Inventor: Hideo Sugawara, Ohtawara, Japan

[73] Assignee: Fujitsu Limited, Kawasaki, Japan

[21] Appl. No.: 665,755

[22] Filed: Mar. 7, 1991

[30] Foreign Application Priority Data

Mar. 7, 1990 [JP] Japan .................................. 2-55545

[51] Int. Cl.$^5$ .............................................. H03B 5/18
[52] U.S. Cl. ............................................ 331/96; 331/77; 331/99; 331/107 SL; 331/117 D
[58] Field of Search ........................ 331/74, 77, 96, 99, 331/100, 107 DP, 107 SL, 117 D; 333/32–35

[56] References Cited

U.S. PATENT DOCUMENTS

| | | | |
|---|---|---|---|
| 3,868,594 | 2/1975 | Cornwell et al. | 331/99 |
| 4,728,909 | 3/1988 | Rudelle | 331/117 D |

*Primary Examiner*—David Mis
*Attorney, Agent, or Firm*—Staas & Halsey

[57] ABSTRACT

The microwave oscillation circuit provides a transistor having the collector electrode grounded, the base electrode connected to a resonator circuit determining the oscillation frequency, and the emitter electrode connected to an output open stub. An output transmission line is placed parallel to the output open stub for the output power supplied from the output open stub to be output via an end of the output transmission line to a buffer amplifier. A resistor having an impedance equal to a characteristic impedance of the output transmission line connects a stub circuit to an open end of the output transmission line. The stub circuit exhibits an infinite impedance at the oscillation frequency. At the oscillation frequency, the resistor floats due to the infinite impedance of the stub circuit so that all the oscillation power supplied from the output open stub is output to the buffer amplifier, without being consumed by the resistor. At frequencies other than the oscillation frequency, where the buffer amplifier is likely to be unstable, the output impedance of the output transmission line is damped enough to prevent the buffer amplifier from its unstable condition, because the resistor is grounded by a relatively low impedance of the stub circuit.

22 Claims, 4 Drawing Sheets

FIG. 5
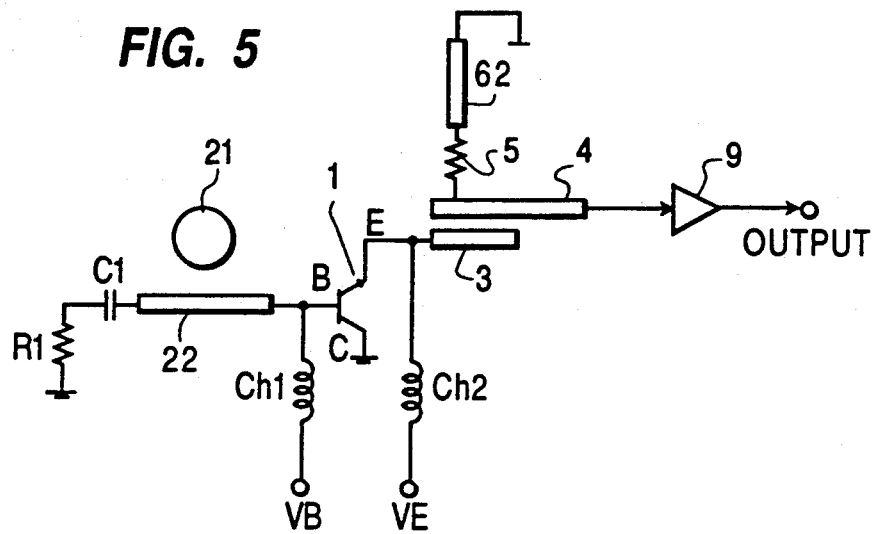
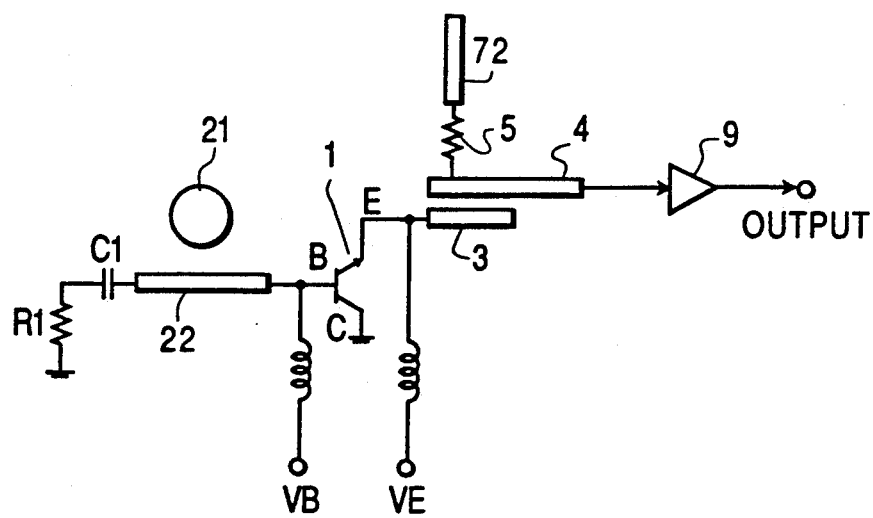
FIG. 6

5,079,524

MICROWAVE OSCILLATION CIRCUIT

BACKGROUND OF THE INVENTION

1. Field of the Invention

This invention relates to a microwave oscillation circuit used in microwave radio equipment.

2. Description of the Related Art

A prior art microwave oscillation circuit is shown in FIG. 1. Collector electrode C of a transistor 1 is grounded. The base electrode B is connected to a transmission line 22 which is coupled with a resonator 21 which determines the oscillation frequency and also is connected to a resistor $R_1$ via a capacitor $C_1$ at the opposite end. Resonator 21 is typically formed of a dielectric resonator of $TE_{01\delta}$ mode. Capacitor $C_1$ is to block DC (direct current) current. The coupling via space L between the transmission line 22 and the resonator 21 is chosen so that the oscillation is sufficiently stable and includes minimum noises. A base bias voltage $V_B$ is supplied via a choke $Ch_2$. The emitter is connected to an output stub, which is an open stub 3 of an appropriate length for the oscillation condition. An output transmission line 4 is placed in parallel to the output open stub 3 via an appropriate space therebetween. Output power of the oscillator is supplied from open stub 3 to the output transmission line 4. Emitter voltage $V_E$ is supplied via a second choke $Ch_1$. An end of output transmission line 5 is open and another end P is connected to an input terminal Q of a buffer amplifier 5. If this connection is direct as shown by the numeral 41 in FIG. 1, the output impedance $Z_s$ looking at the output transmission line 4 from the input terminal Q is deviated far from the matched condition, such as very high impedance, because the opposite end is open. This mis-matched condition is likely to cause an unstable operation of buffer amplifier 5, such as a spurious oscillation at a very low frequency caused from increased amplification capability of the microwave transistor used in buffer amplifier 5. Therefore, in order to prevent this problem, there has been employed an isolator 42, an attenuator 43 or a 50-ohm series resistor 44 in place of the direct connection. The employment of 50-ohm series resistor 44 is disclosed in Japanese Tokukai Sho 64-62005 by the same inventor. However, in these prior arts, there is a problem in that and the additional device, such as isolator 42 or attenuator 43, is expensive, as well as the output power of the oscillator is attenuated to input to the buffer amplifier 5.

SUMMARY OF THE INVENTION

It is an object of the invention, therefore, to provide a stable and less expensive oscillation circuit, without employing expensive component.

A microwave oscillation circuit of the invention comprises: a transistor having a first terminal grounded, a second terminal connected to a resonator circuit determining the oscillation frequency, and a third terminal connected to an output open stub; an output transmission line placed in parallel to the open stub so that an output power supplied from the output open stub is output via an end of the output transmission line to a buffer amplifier; a stub circuit which exhibits a substantially infinite impedance at the oscillation frequency; and a resistor having an impedance substantially equal to characteristic impedance of the output transmission line connects the stub circuit to an open end of the output transmission line. At the oscillation frequency the resistor is floating due to the infinite impedance of the stub circuit so that all the oscillation power supplied from the output open stub is output to the buffer amplifier, without being consumed by the resistor. At other frequencies than the oscillation frequency, where the buffer amplifier is likely to be unstable, the output impedance of the output transmission line is damped enough to prevent the buffer amplifier from its unstable condition, because the resistor is grounded by a relatively low impedance of the stub circuit.

The above-mentioned features and advantages of the present invention, together with other objects and advantages, which will become apparent, will be more fully described hereinafter, with reference being made to the accompanying drawings which form a part thereof, wherein like numerals refer to like parts throughout.

A BRIEF DESCRIPTION OF THE DRAWINGS

FIG. 5 shows a circuit diagram of a third preferred embodiment of the present invention;

FIG. 6 shows a circuit diagram of a fourth preferred embodiment of the present invention;

DESCRIPTION OF THE PREFERRED EMBODIMENTS

Figure 1:
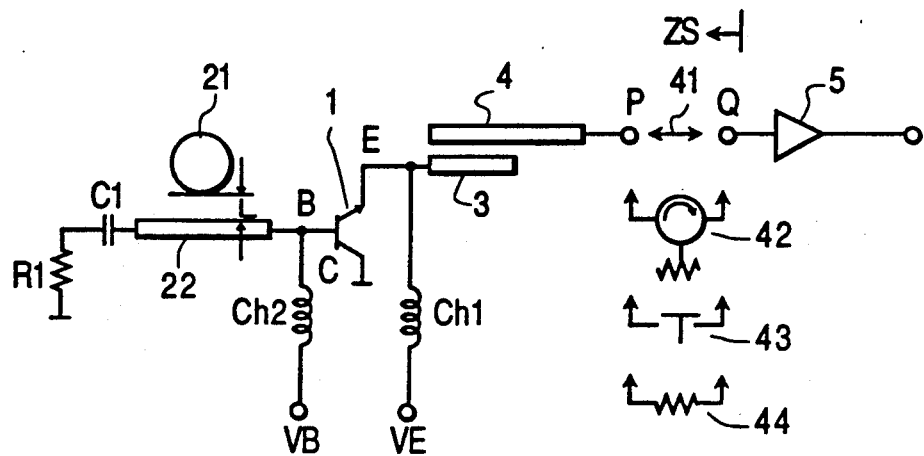
FIG. 1 shows a circuit diagram of a prior art microwave oscillation circuit.
Figure 2:
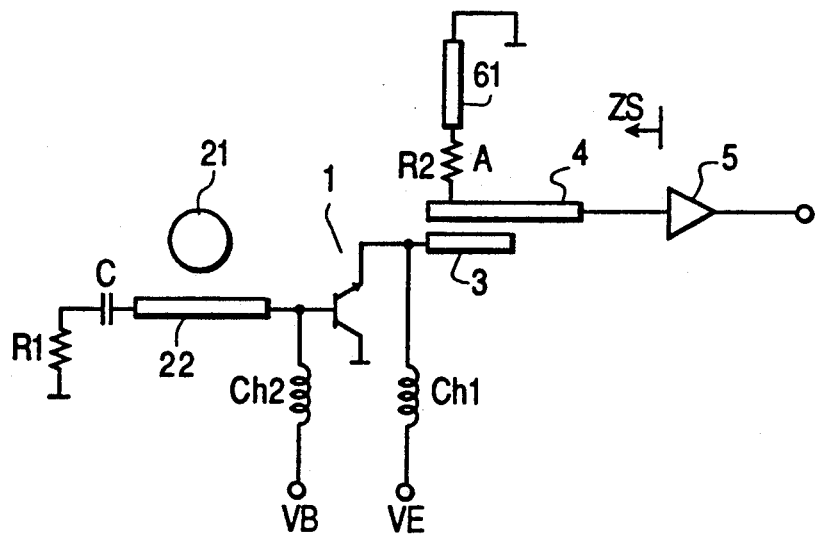
FIG. 2 shows a circuit diagram of a first preferred embodiment of the present invention.

A circuit diagram of a first preferred embodiment of the present invention for generating a 5 GHz signal is shown in FIG. 2. Collector electrode C of a transistor 1 is grounded. The circuits are constructed of strip lines having 0.8 mm thick TEFLON therein, as described below for FIG. 3. The base electrode B is connected to a 20 mm long transmission line 22 having a 50-ohm characteristic impedance. A resonator 21 which is typically formed of a dielectric resonator of $TE_{01\delta}$ mode so as to determine the oscillation frequency is placed by a side of base transmission line 22. The degree of the electromagnetic coupling between base transmission line 22 and resonator 21 is determined so that the oscillation is sufficiently stable and includes minimum noises. Another end, opposite from the base electrode B, of transmission line 22 is grounded via a capacitor $C_1$ and a 50 ohm first resistor $R_1$. At the resonance frequency the impedance looking at base transmission line 22 from the base electrode B is very high due to the resonance of resonator 21 coupled therewith. At the other frequencies than the resonance frequency, the impedance is nearly matched to 50 ohm owing to the terminating first resistor $R_1$. Accordingly, the length of base transmission line 22 is just for coupling with resonator 21. A base bias voltage $V_B$ is supplied to base electrode B via a choke $Ch_2$. Capacitor $C_1$ is to block DC (direct current) current to flow into first resistor $R_1$. The emitter electrode E is connected to an output open stub having a 50-ohm characteristic impedance and 4.6 mm long. An output transmission line 4 having a 50-ohm characteristic impedance is placed in parallel to the output open stub 3 by a 0.3 mm space. Output power of the oscillator is coupled from the output open stub 3 via this space to the output transmission line 4. Degree of the coupling depends on the space therebetween and the width at which the output open stub 3 faces the output transmission line 4. The maximum coupling is achieved when the facing width is $L_g/4$. The more coupling provides the more output power; and the less coupling provides the more Q value of the oscillation circuit. Therefore, the degree of the coupling is determined by trading off the power and the Q value. Emitter electrode E is also supplied with an emitter voltage $V_E$ via a second choke $Ch_1$. A first end of the output transmission line 4 is connected to a buffer amplifier 5. A second end, opposite from the first end P, of output transmission line 4 is connected via a second resistor $R_2$ to an approximately 11 mm long short stub 61, which is equivalent to a quarter wavelength along the transmission line of stub 61 at the oscillation frequency. Another end of short stub 61 is grounded. Therefore, short stub 61 exhibits an infinite impedance to second resistor $R_2$, which means that second resistor $R_2$ is floated and consequently exhibits an infinite impedance to the output transmission line 4. Accordingly, the second resistor $R_2$ has no effect to the output transmission line 4 at the oscillation frequency. Then, all the oscillation power supplied from the output open stub 3 is output to buffer amplifier 5, without being consumed in second resistor $R_2$. On the other hand, at frequencies other than the oscillation frequency, such as 2 GHz, where the buffer amplifier 5 connected to the output transmission line 4 is likely to be unstable, the impedance of short stub 61 becomes drastically smaller than the infinite value, for example, at 2 GHz the impedance becomes $+36j$ ohm. Then, the output impedance $Z_s$ looking at the output transmission line 4 from buffer amplifier 5 is damped by the series impedance of second resistor $R_2$ and the short stub 61, i.e. $(50+36j)$ ohm. Thus damped output transmission line 4 exhibits as low as 2.0 V.S.W.R. (voltage standing wave ratio) at this frequency 2 GHz. Accordingly, owing to second resistor $R_2$ buffer amplifier 5 is prevented from its unstable condition, such as a parasitic oscillation, resulting in its stable operation.

Figure 3:
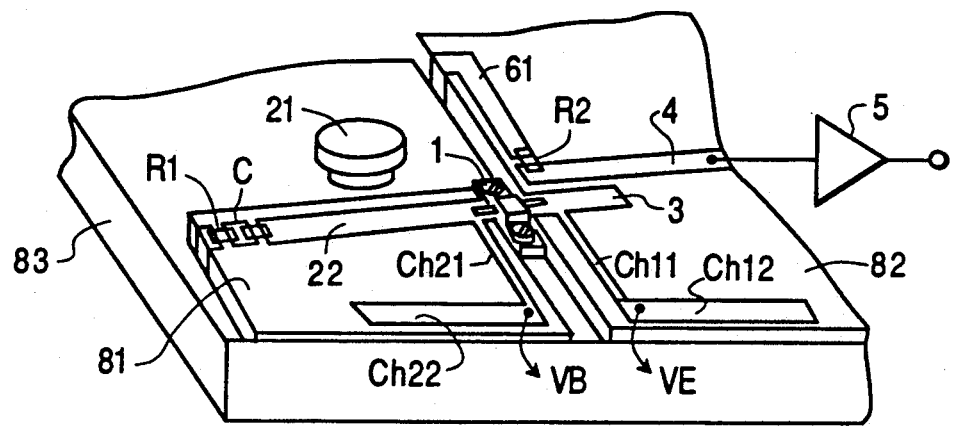
FIG. 3 shows a perspective view of a practical circuit of the first preferred embodiment of the present invention.

FIG. 3 shows a perspective view of the FIG. 2 first preferred embodiment circuit. 0.8 mm thick printed circuit boards 81 and 82 made of, for example, a composition of TEFLON and glass fiber, are mounted on a metal plate 83. The 50 ohm transmission lines, 3, 4, 22, 61, $Ch_{12}$ and $Ch_{22}$, are formed of 2.2 mm wide strip lines. Other transmission line, $Ch_{11}$ and $Ch_{21}$, as chokes, are of 0.4 mm wide strip lines. Each of chokes $Ch_{11}$, $Ch_{21}$, $Ch_{12}$ and $Ch_{22}$ is approximately 11 mm long, i.e. a quarter of the effective wavelength, so that the impedance looked at from the base electrode and the emitter electrode are infinite, respectively. The DC voltages, $V_E$ and $V_E$, are supplied to each of the connection points between chokes $Ch_{11}$ and $Ch_{12}$, and $Ch_{21}$ and $Ch_{22}$, respectively, where the standing wave voltages are minimum. Microwave transistor 1, whose collector electrode is directly mounted on a heavy heat sink, is mounted on metal plate 83. Resonator 21 is placed on metal plate 83, and is coupled with transmission line 22 mainly by magnetic fluxes. Each end of first resistor $R_1$ and short stub 61 is grounded to metal plate 83. Other dimensions are already described for FIG. 2 circuit diagram.

Figure 4:
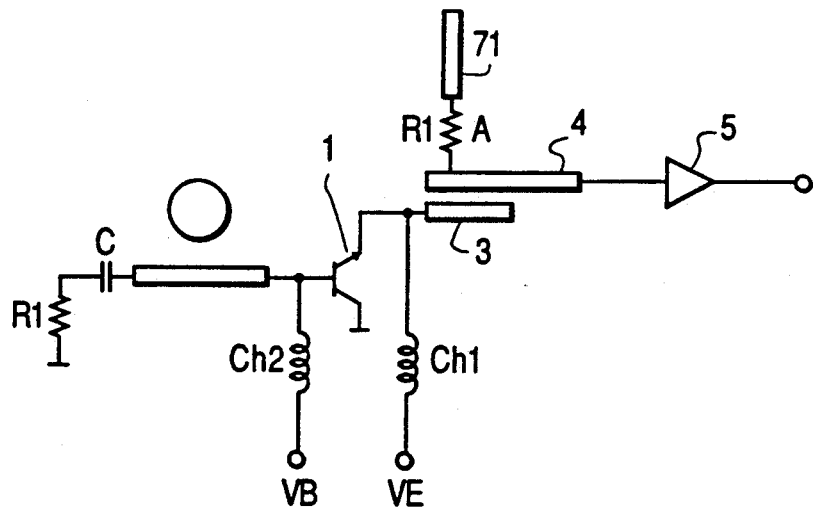
FIG. 4 shows a circuit diagram of a second preferred embodiment of the present invention.

A circuit diagram of a second preferred embodiment of the present invention is shown in FIG. 4, where the infinite impedance element formed of a quarter wavelength short stub 61 in the FIG. 2 first preferred embodiment is replaced with a half wavelength open stub 71, which also exhibits an infinite impedance for the oscillation frequency, and accordingly, acts the same function as short stub 61; that is, open stub 71 makes second resistor $R_2$ float at the oscillation frequency, but grounds second resistor $R_2$ via the stub's relatively low impedance at other frequencies than the oscillation frequency.

A third and subsequent preferred embodiments of the present invention are for outputting a harmonic frequency of the oscillation frequency, where infinite impedance stubs, 61 or 71, tuned for the oscillation frequency in the first and second preferred embodiments is replaced with an infinite impedance stub which is in resonance at a particular harmonic frequency $f_h (=nf_o,$ where $f_o$ indicates the oscillation frequency and n indicates an integer larger than 1) to be output. In the third preferred embodiment shown in FIG. 5, the infinite impedance element is formed of a short stub 62 of a quarter of the effective wavelength $L_{gh}$ of the harmonic frequency $f_h$ to be output. In a fourth preferred embodiment shown in FIG. 6, the infinite impedance element is formed of an open stub 72 of a half of the effective wavelength $L_{gh}$ of the harmonic frequency $f_h$. In the case where the oscillation frequency is 5 GHz, and the output frequency is 10 GHz, i.e. $n=2$, short stub 62 is approximately 5.5 mm long. All the other parts are basically the same as those of the first and second preferred embodiments. Thus, the particular harmonic frequency component included in the oscillation signal and tuned to the infinite impedance element 62 or 72 is effectively transferred from the output open stub 3 into the output transmission line 4, and accordingly is output to buffer amplifier. At the other frequencies than this harmonic frequency to be output, second resistor 5 being grounded via infinite impedance stub which exhibits then a relatively low impedance not only damps that frequency component but also makes the output impedance looked at from buffer amplifier 5 near to 50 ohm, the matched condition. Therefore, buffer amplifier 5 can be stable at the frequencies other than the oscillation frequency.

Figure 7:
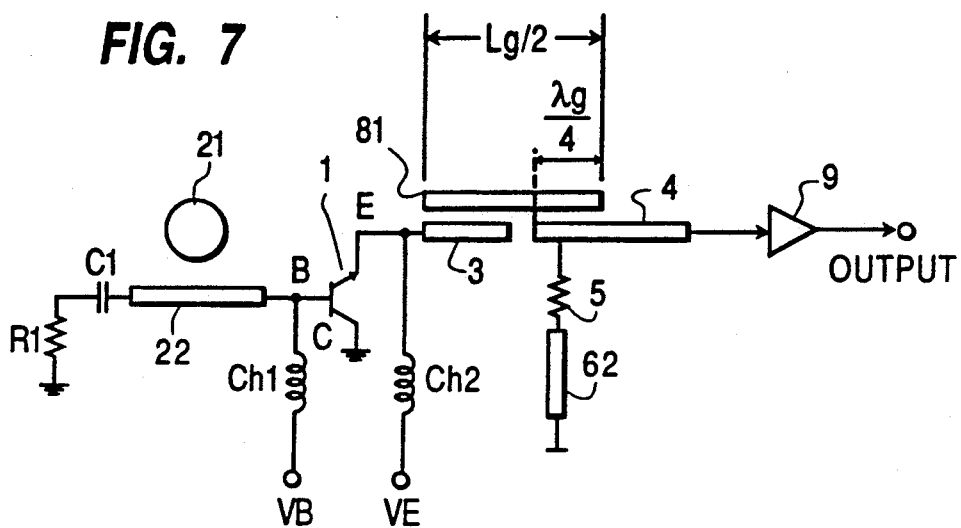
FIG. 7 shows a circuit diagram of a fifth preferred embodiment of the present invention.
Figure 8:
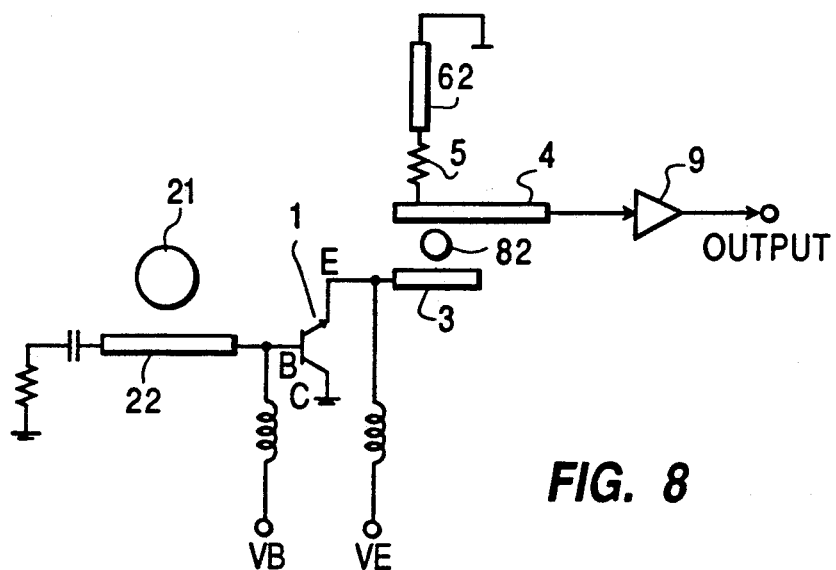
FIG. 8 shows a circuit diagram of a sixth preferred embodiment of the present invention.

Circuit diagrams of fifth and sixth preferred embodiments of the present invention are shown in FIG. 7 and FIG. 8, where a resonator tuned to the particular harmonic frequency to be output is provided between the output open stub 3 and the output transmission line 4, so that this resonator acts as a bandpass filter which allows the tuned harmonic frequency $f_h$ to pass therethrough and attenuates all the other frequencies.

In the FIG. 7 fifth preferred embodiment, the bandpass resonator is formed of a strip line resonator 81 of a half of the effective wavelength $L_{gh}$ of the output frequency $f_h$, and is placed in parallel respectively to the output open stub 3 and the output transmission line 4 by a 0.3 mm space. The width at which strip line resonator 81 faces the output open stub 3 and the width at which resonator stub 81 faces the output transmission line 4 are selected to achieve optimum coupling conditions therebetween. In FIG. 7, the latter width is chosen as $L_{gh}/2$ which provides maximum coupling therebetween. Though it is described that filter stub 81 is of a half wavelength, it is apparent that the length may also be $nL_{gh}/2$, where n indicates an integer, to be resonant at the output frequency.

In the FIG. 8 sixth preferred embodiment, the resonator formed of a dielectric resonator of $TE_{01\delta}$ mode 82 is located between the output open stub 3 and the output transmission line 4, where dielectric resonator 82 is coupled with the output open stub 3 and the output transmission line 4 mainly by magnetic flux. Very high Q characteristics of the dielectric resonator is advantageously effective to select the desired frequency while attenuating other undesirable frequencies.

Though in the above preferred embodiments, the infinite impedance stubs, 61, 71, 62 and 72, are formed of a quarter or a half of the effective wavelength, it is apparent the infinite impedance stubs can be formed of a $(2n+1)L_g/4$ long short stub or an $nL_{gh}/2$ long open stub for the case where the oscillation frequency is to be output, and a $(2n+1)L_{gh}/4$ long short stub or an $nL_{gh}/2$ long open stub for the case where the harmonic frequency is to be output, where either n indicates an integer.

Though in the above preferred embodiments, the infinite impedance stub, 61, 71, 62 or 72, is connected to the open end of the output transmission line 4, it is apparent that the connection point may be arbitrarily selected along the output transmission line 4 apart from the open end so that the impedances for some problem frequencies are optimum. At any location of the connection point, the second resistor has no effect on the operation at the output frequency.

Though in the above preferred embodiments the collector electrode of the transistor is grounded and the emitter electrode is the output terminal, it is apparent that any other electrode configuration, such as grounded-emmitter or grounded-base configuration, may be embodied according to the concept of the present invention.

Though in the above preferred embodiments, the transistor is referred to as a bipolar transistor, it is apparent that the transistor can be a FET (field effect transistor). GaAs (gallium arsenide) FET is preferably employed in microwave equipment. According to the typical configuration of above embodiments, microwave FET is configurated so that the drain electrode is grounded, the gate electrode is connected to transmission line 22 and the source electrode is connected to the output open stuab 3.

The many features and advantages of the invention are apparent from the detailed specification and thus, it is intended by the appended claims to cover all such features and advantages of the methods which fall within the true spirit and scope of the invention. Further, since numerous modifications and changes will readily occur to those skilled in the art, it is not detailed to limit the invention and accordingly, all suitable modifications are equivalents may be resorted to, falling within the scope of the invention.

What I claim is:

1. A microwave oscillation circuit with a ground, comprising:
   an output open stub;
   a resonator circuit;
   a transistor having a first terminal operatively connected to the ground, a second terminal operatively connected to said resonator circuit and determining an oscillation frequency, and a third terminal connected to said output open stub;
   an output transmission line placed substantially parallel to and along side said output open stub, an output power supplied from said output open stub being output via an end of said output transmission line;
   an infinite stub circuit exhibiting a substantially infinite impedance at the oscillation frequency; and
   a resistor connected between said infinite stub circuit and said output transmission line.

2. A microwave oscillation circuit as recited in claim 1, wherein said resistor is connected substantially to an open end of said output transmission line.

3. A microwave oscillation circuit as recited in claim 1, wherein a resistance value of said resistor is substantially equal to a characteristic impedance of said output transmission line.

4. A microwave oscillation circuit as recited in claim 1, wherein said stub circuit is formed of a short stub length of which is substantially $(2n+1)L_g/4$, where n indicates 0 or a positive integer, and $L_g$ indicates an effective wavelength of said oscillation frequency along said stub circuit.

5. A microwave oscillation circuit as recited in claim 1, wherein said stub circuit is formed of an open stub length of which is substantially $n(L_g/2)$, where n indicates a positive integer, and $L_g$ indicates an effective wavelength of said oscillation frequency along said stub circuit.

6. A microwave oscillation circuit as recited in claim 1, wherein said first terminal is a collector, said second terminal is a base and said third terminal is an emitter.

7. A microwave oscillation circuit as recited in claim 1, wherein said transistor is a field effect transistor, where said first terminal is a drain, said second terminal is a gate and said third terminal is a source.

8. A microwave oscillation circuit with a ground, comprising:
   an output open stub;
   a resonator circuit;
   a transistor having a first terminal operatively coupled to the ground, a second terminal operatively connected to the resonator circuit and determining an oscillation frequency, and a third terminal connected to said output open stub;
   an output transmission line configured substantially parallel with said output open stub, and output signal supplied from said output open stub being output via an end of said output transmission line;
   an infinite stub circuit exhibiting a substantially infinite impedance at a harmonic frequency of the oscillation frequency; and
   a resistor connected between said infinite stub circuit and said output transmission line.

9. A microwave oscillation circuit as recited in claim 8, wherein said resistor is connected to an open end of said output transmission line.

10. A microwave oscillation circuit as recited in claim 8, wherein said resistor has a resistance value substantially equal to a characteristic impedance of said output transmission line.

11. A microwave oscillation circuit as recited in claim 8, wherein said infinite stub circuit is formed of a short stub length of which is substantially $(2n+1)L_{gh}/4$, where n indicates 0 or a positive integer and $L_{gh}$ indicates an effective wavelength of said harmonic frequency along said infinite stub circuit.

12. A microwave oscillation circuit as recited in claim 6, wherein said stub circuit is formed of an open stub length of which is substantially $n(L_g/2)$, where n indicates a positive integer and $L_{gh}$ indicates an effective wavelength of said harmonic frequency along said infinite stub circuit.

13. A microwave oscillation circuit as recited in claim 8, further comprising a bandpass filter tuned to said harmonic frequency and operatively connected between said output open stub and said output transmission line.

14. A microwave oscillation circuit as recited in claim 13, wherein said bandpass filter is formed of a dielectric resonator.

15. A microwave oscillation circuit as recited in claim 13, wherein said bandpass filter is formed of a $nL_{gh}/2$ long strip line resonator placed in parallel to said output open stub and said output transmission line, where n indicates an integer representing the degree of the harmonic frequency and $L_{gh}$ indicates an effective wavelength along said open stub at said harmonic frequency.

16. A microwave oscillation circuit as recited in claim 8, wherein said first terminal is a collector, said second terminal is a base and said third terminal is an emitter.

17. A microwave oscillation circuit as recited in claim 8, wherein said transistor is a field effect transistor, where said first terminal is a drain, said second terminal is a gate and said third terminal is a source.

18. A microwave matching circuit for matching an oscillation frequency with an amplifier connected to receive an output signal, comprising:
- an output open stub capable of providing an oscillation frequency;
- an output transmission line configured substantially parallel with said output open stub and having an end to provide the output signal;
- an infinite stub exhibiting a substantially infinite impedance at a harmonic frequency of the oscillation frequency; and
- an impedance connected between said infinite stub and said output transmission line.

19. A microwave oscillation circuit according to claim 18, wherein said impedance is composed of a resistor.

20. A microwave oscillation circuit according to claim 19, further comprising:
- a bandpass filter element coupled between said output open stub and said output transmission line.

21. A microwave oscillation circuit according to claim 18, wherein said infinite stub comprises a quarter wavelength short stub.

22. A microwave oscillation circuit according to claim 18, wherein said infinite stub comprises a half wavelength open stub.

* * * * *

UNITED STATES PATENT AND TRADEMARK OFFICE
CERTIFICATE OF CORRECTION

PATENT NO. : 5,079,524

DATED : January 7, 1992

INVENTOR(S) : Sugawara

It is certified that error appears in the above-identified patent and that said Letters Patent is hereby corrected as shown below:

Col. 6, line 68, claim 12 should depend from claim 8.

Signed and Sealed this

Twenty-fifth Day of May, 1993

Attest:

MICHAEL K. KIRK

Attesting Officer

Acting Commissioner of Patents and Trademarks